United States Patent
Lin et al.

(10) Patent No.: US 7,033,903 B2
(45) Date of Patent: Apr. 25, 2006

(54) METHOD AND APPARATUS FOR FORMING PATTERNED PHOTORESIST LAYER

(75) Inventors: Jack Lin, Taichung (TW); Calvin Wu, Tainan (TW); George K C Huang, Tainan (TW)

(73) Assignee: United Microelectronics Corp., Hsinchu (TW)

(*) Notice: Subject to any disclaimer, the term of this patent is extended or adjusted under 35 U.S.C. 154(b) by 9 days.

(21) Appl. No.: 10/782,369

(22) Filed: Feb. 18, 2004

(65) Prior Publication Data
US 2005/0181571 A1    Aug. 18, 2005

(51) Int. Cl.
*H01L 21/331* (2006.01)

(52) U.S. Cl. ...................................... 438/377

(58) Field of Classification Search ............ None
See application file for complete search history.

(56) References Cited

U.S. PATENT DOCUMENTS

| | | | | |
|---|---|---|---|---|
| 5,124,927 A | * | 6/1992 | Hopewell et al. | ............ 700/121 |
| 6,759,112 B1 | * | 7/2004 | Wong | ............ 428/67 |
| 6,852,456 B1 | * | 2/2005 | Byers et al. | ................. 430/30 |

* cited by examiner

Primary Examiner—Thao P. Le
(74) Attorney, Agent, or Firm—J.C. Patents

(57) ABSTRACT

A method for forming a patterned photoresist layer aligned with a predetermined layer is described. A photoresist layer is formed on a substrate and then exposed. The overlay offset between the exposed portions of the photoresist layer and the predetermined layer is measured for determining whether the exposed portions of the photoresist layer are aligned with the predetermined layer. A development step is performed when the exposed portions of the photoresist layer are found to align with the predetermined layer. An apparatus for forming a patterned photoresist layer is also described, which utilizes the aforementioned method and has a mechanism capable of feeding back the overlay offset in real time for reducing the cycle time and the rework time in the lithography process.

7 Claims, 4 Drawing Sheets

METHOD AND APPARATUS FOR FORMING PATTERNED PHOTORESIST LAYER

BACKGROUND OF THE INVENTION

1. Field of the Invention

The present invention relates to a method and an apparatus for forming a patterned photoresist layer. More particularly, the present invention relates to a method and an apparatus for forming a patterned photoresist layer wherein an overlay offset is measured and fed back in real time.

2. Description of the Related Art

In accompany with the advances in semiconductor industry, numerous high-performance semiconductor apparatuses or integrated circuits including millions of devices like transistors, capacitors and resistors have been developed. To enhance the performance of a semiconductor apparatus or an integrated circuit, its integration degree has to be increased. More specifically, the number of conductive layers has to be increased and/or the critical dimension (CD) of devices has to be reduced.

Since the integration degrees of integrated circuits increase continuously, the alignment precision between different wafer layers becomes an important issue. For example, when misalignment occurs between conductive lines and plugs of an integrated circuit, the integrated circuit may have a low performance or even fail. Misalignment also occurs easily in doping or ion-implantation process lowering the performance of the integrated circuit.

Generally, the pattern of a film or doping/ion-implantation regions in a film in an integrated circuit is defined by a patterned photoresist layer formed in a lithography process including an exposure step and a development step. Therefore, it is necessary to measure the overlay offset of the patterned photoresist layer after the lithography process for detecting possible misalignment.

FIG. 1 illustrates a process flow for forming a patterned photoresist layer in the prior art. Referring to FIG. 1, a photoresist layer is coated on a wafer (S100), exposed using an exposure tool (S110) and then developed (S120) to form a patterned photoresist layer. The overlay offset between the photoresist patterns and another film is then measured (S130). The next step (S140) is to determine whether the overlay offset is within a tolerable range or not, i.e., whether the photoresist patterns are sufficiently aligned with other films or not. If the answer is yes, the next process is performed (S150). Otherwise, the photoresist layer is removed for rework, and a control signal is fed back to the exposure tool from the overlay measurement tool (S160) so that the exposure conditions in the rework can be adjusted accordingly.

In the prior art, the overlay measurement tool is usually an ACML (product name) tool. However, since the ACLM tool is used after the development step, the development liquid is wasted when a rework is required. Moreover, an ACML tool cannot measure an overlay offset and feedback a control signal to the exposure tool in real time, so that the wafers processed before reception of the control signal have to be reworked when the overlay offset measured is not within the tolerable range. In addition, an ACML tool is usually quite expensive increasing the manufacturing cost. Furthermore, the use of an ACML tool requires overlay marks being formed on the scribe line regions of a wafer, so that the scribe line regions cannot be further narrowed.

SUMMARY OF THE INVENTION

Accordingly, this invention provides a method for forming a patterned photoresist layer, in which an overlay offset of the photoresist patterns is fed back in real time for reducing the cycle time and the rework time in the lithography process.

This invention also provides an apparatus for forming a patterned photoresist layer that has a mechanism capable of feeding back an overlay offset of the photoresist patterns in real time for reducing the cycle time and the rework time in the lithography process.

A method for forming a patterned photoresist layer of this invention is suitably used to form a patterned photoresist layer aligned with a predetermined wafer layer, including the following steps (a)–(e). A photoresist layer is formed on a substrate in step (a) and then exposed in step (b). The overlay offset between the exposed portions of the photoresist layer and the predetermined layer is measured in step (c), and the overlay offset is used to determine whether the alignment precision of the exposed portions of the photoresist layer is acceptable or not in step (d). If the answer is yes, the photoresist layer is developed in step (e).

If the alignment precision is not acceptable, however, a step (f) of removing photoresist and the above steps (a)–(d) are repeated in sequence for at least one cycle until the alignment precision is determined to be acceptable in step (d). In each cycle of steps, the exposure condition is calibrated according to the overlay offset measured in step (c) of the preceding cycle.

According to an embodiment of this invention, a latent image is formed in the photoresist layer in the exposure step, and the overlay offset measurement is done by scanning the latent image with a laser beam and analyzing the signals generated from the laser scanning. The overlay offset is used to determine whether the alignment precision of the latent image is acceptable or not.

Another method for forming a patterned photoresist layer of this invention includes the following steps (a)–(e). A photoresist layer is formed on a substrate in step (a). In step (b), an exposure/overlay-measurement tool is used to expose the photoresist layer to form a latent image therein. In step (c), the overlay offset between the latent image and a predetermined wafer layer is measured using the exposure/overlay-measurement tool. The overlay offset is compared with a predetermined value in step (d). If the overlay offset is smaller than the predetermined value, the photoresist layer is developed in step (e).

If the overlay offset is larger than the predetermined value, however, a step (f) of removing photoresist and the above steps (a)–(d) are repeated in sequence for at least one cycle until the overlay offset is found to be smaller than the predetermined value in step (d). In each cycle of steps, the exposure condition is calibrated according to the overlay offset measured in step (c) of the preceding cycle. The method for calibrating the exposure condition includes, for example, feeding back a control signal generated based on the overlay offset to the exposure/overlay-measurement tool before the photoresist layer is removed to order the latter to calibrate the exposure condition.

According to an embodiment of this invention, the aforementioned overlay offset measurement is done by scanning the latent image of the photoresist layer with a laser beam and analyzing the signals generated from the laser scanning. The overlay offset is used to determine whether the alignment precision of the latent image is acceptable or not.

An apparatus for forming a patterned photoresist layer of this invention is suitably used to form a patterned photoresist layer aligned with a predetermined wafer layer, including at least a photoresist coating tool, an exposure/overlay-measurement tool, a development tool and a substrate carrying tool. The photoresist coating tool is for coating a photoresist layer on a substrate. The exposure/overlay-measurement tool is used to expose the photoresist layer to form a latent image therein and to measure the overlay offset between the latent image and the predetermined layer. The development tool is for developing the photoresist layer, and the substrate carrying tool is connected between the photoresist coating tool, the exposure/overlay-measurement tool and the development tool for carrying the substrate between them.

According to an embodiment of this invention, the above apparatus may further include a photoresist removal tool. The photoresist removal tool may be connected with the exposure/overlay-measurement tool and/or the photoresist coating tool via the substrate carrying tool.

The substrate carrying tool can carry the substrate to the photoresist removal tool or the development tool according to the overlay offset value. Specifically, when the overlay offset is overly large, the substrate carrying tool will carry the substrate to the photoresist removal tool for rework. When the overlay offset is within a tolerable range, the substrate carrying tool will carry the substrate to the development tool for developing the photoresist layer.

The above exposure/overlay-measurement tool is constituted of an exposure module and an overlay measurement module, for example. The exposure module is for forming a latent image in the photoresist layer. The overlay measurement module is for measuring the overlay offset between the latent image and the predetermined layer and for feeding back a control signal generated based on the overlay offset to the exposure module.

The exposure module includes an exposure light source and a photomask, for example, wherein the exposure light source may be disposed over the substrate, and the photomask may be disposed between the exposure light source and the substrate. The overlay measurement module may include a laser light source, a signal reception device and a signal feedback device. The laser light source is for scanning the latent image, the signal reception device is for receiving a test signal generated from the laser scanning that contains the information of the overlay offset. The signal feedback device is used to generate a control signal based on the test signal and feedback the control signal to the exposure module.

Since the overlay measurement is performed after the exposure step and before the development step in this invention, the overlay offset can be fed back in real time to avoid undesired rework.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

To solve the aforementioned problems in the prior art, this invention integrates an overlay measurement module and an exposure module together so that the overlay measurement can be performed after the exposure step and before the development step to monitor the overlay offset in real time. By doing so, both the cycle time and the rework time in the lithography process can be reduced effectively.

Figure 1:
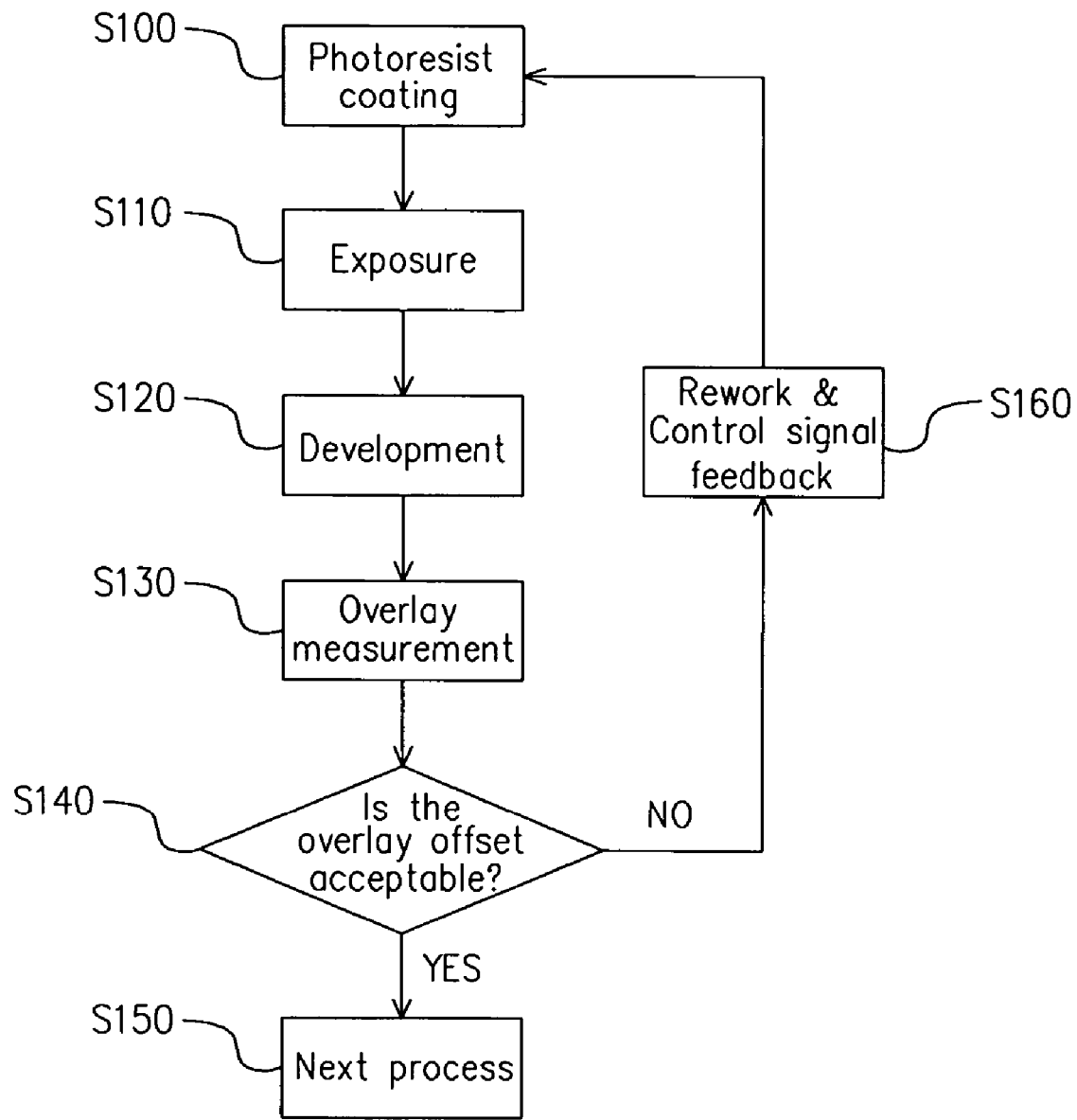
FIG. 1 illustrates a process flow for forming a patterned photoresist layer in the prior art.
Figure 2:
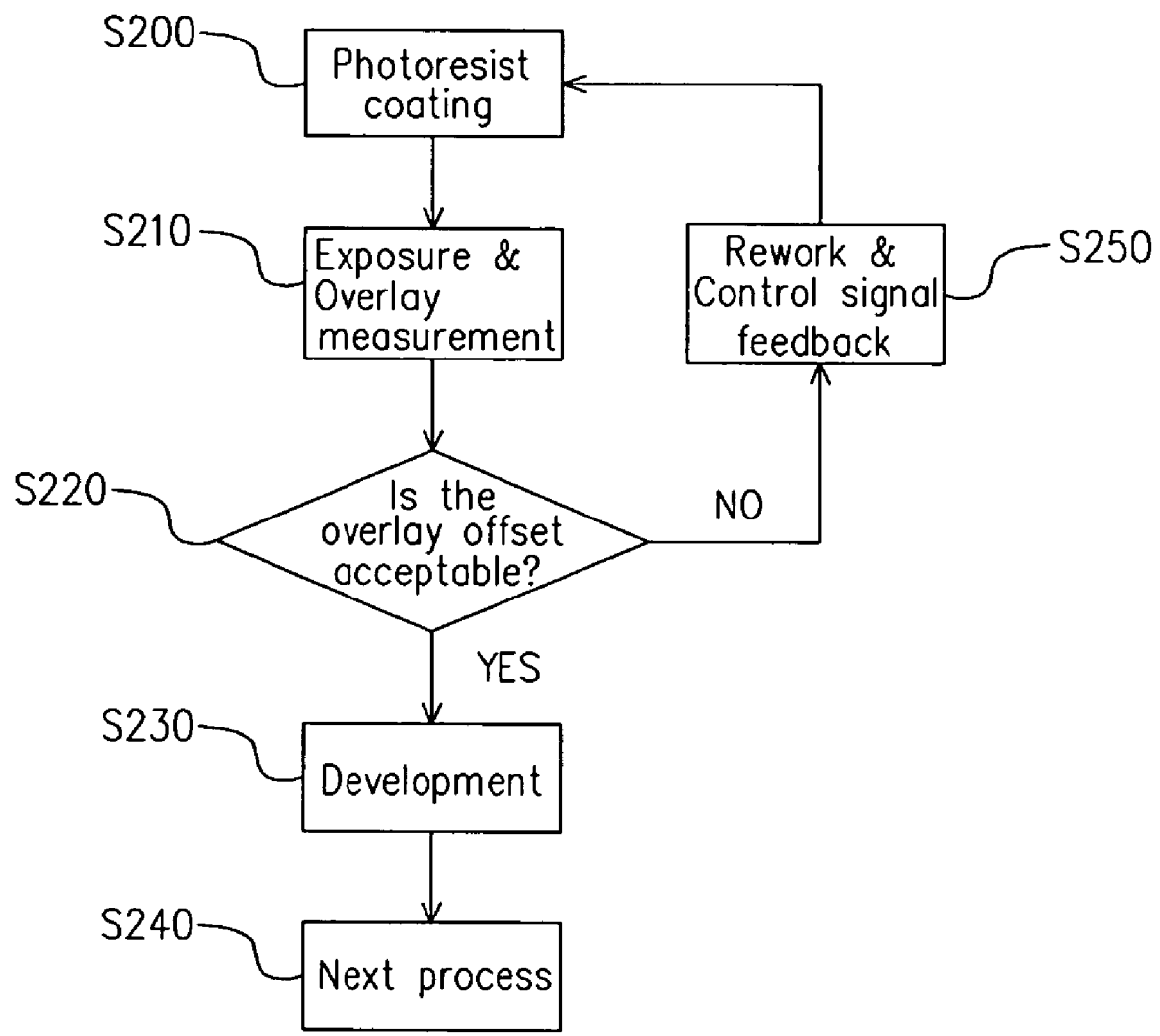
FIG. 2 illustrates a process flow for forming a patterned photoresist layer according to a preferred embodiment of this invention.

FIG. 2 illustrates a process flow for forming a patterned photoresist layer according to the preferred embodiment of this invention. At first, a substrate is provided with some films formed thereon. The substrate is, for example, a wafer for fabricating semiconductor apparatuses or integrated circuits, a glass substrate, a quartz substrate, a plastic substrate or a silicon substrate for fabricating display panels, or a plastic substrate or a ceramic substrate for fabricating printed circuit boards (PCB).

Thereafter, a photoresist layer is formed on the substrate (S200). The photoresist layer is then exposed, and the overlay offset between the exposed portions of the photoresist layer and a predetermined wafer layer is measured (S210). In this embodiment, the exposure step and the overlay measurement step are done in the same exposure/overlay-measurement tool, which is used to expose the photoresist layer to form a latent image therein and then measure the overlay offset between the latent image and the predetermined wafer layer.

It is noted that the patterned photoresist layer formed in this embodiment may be one used to define patterns in a semiconductor device or an integrated circuit, such as, patterns of conductive lines, patterns of openings in a dielectric layer, patterns of conductive plugs or patterns of doped regions. Moreover, the patterned photoresist layer may serve as a mask in a film etching process, a doping process, an ion implantation process or a film deposition process. Nevertheless, this invention is not restricted to apply to the above cases, and one skilled in the art may properly modify the aforementioned method for other cases requiring precise alignment without departing from the scope or spirit of the invention.

The overlay offset value is then used to determine whether the alignment precision of the photoresist patterns is acceptable or not (S220). More specifically, the measured overlay offset may be compared with a predetermined value to determine whether the alignment precision of the photoresist layer is acceptable or not. If the overlay offset is smaller than the predetermined value, i.e., the overlay offset is within a tolerable range, the photoresist layer is developed to form photoresist patterns (S230). Thereafter, the patterned photoresist layer is used as a mask to perform a film etching process, a doping process, an ion implantation process or a film deposition process to form a patterned film or doped regions with good alignment precision (S240).

If the overlay offset is larger than the predetermined value, however, a control signal generated based on the overlay offset is fed back to the exposure/overlay-measurement tool, and the photoresist layer is removed for rework (S250). The feedback of the control signal is prior to removal of the photoresist layer, for example. Thereafter, the steps S200–S220 are repeated again, wherein the exposure condition of the photoresist layer is calibrated according to the control signal. If the overlay offset is found to be smaller than the predetermined value in step S220, the photoresist layer is developed to form photoresist patterns (S230). If the overlay offset is still larger than the predetermined value, the steps S250, S200, S210 and S220 are repeated in sequence for at least one cycle until the overlay offset is found to be smaller than the predetermined value, and then the photoresist layer is developed to form photoresist patterns (S230).

Figure 3:
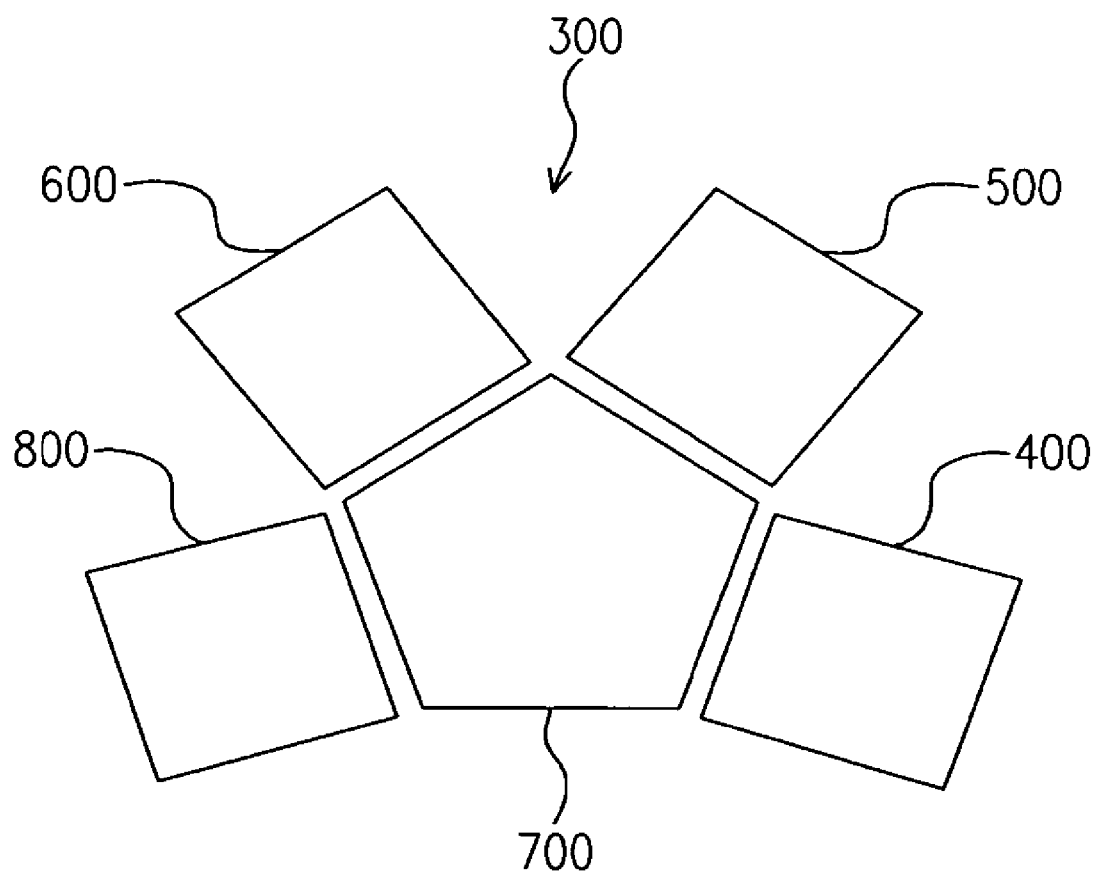
FIG. 3 illustrates an apparatus for forming a patterned photoresist layer according to the preferred embodiment of this invention.

FIG. 3 illustrates an apparatus for forming a patterned photoresist layer according to the preferred embodiment of this invention. The apparatus 300 may be constituted of a photoresist coating tool 400, an exposure/overlay-measurement tool 500, a development tool 600 and a substrate carrying tool 700. The photoresist coating tool 400 is for coating a photoresist layer on the substrate. The exposure/overlay-measurement tool 500 is used to expose the photoresist layer to form a latent image therein and to measure the overlay offset between the latent image and the predetermined layer. The development tool 600 is for developing the photoresist layer, and the substrate carrying tool 700 is connected between the photoresist coating tool 400, the exposure/overlay-measurement tool 500 and the development tool 600 for carrying the substrate between them.

The apparatus 300 for forming a patterned photoresist layer may further include a photoresist removal tool 800. The photoresist removal tool 800 may be connected with the exposure/overlay-measurement tool 500 and/or the photoresist coating tool 400 via the substrate carrying tool 700.

The substrate carrying tool 700 can carry the substrate to the photoresist removal tool 800 or the development tool 600 according to the overlay offset value. Specifically, when the overlay offset is overly large, the substrate carrying tool 700 will carry the substrate to the photoresist removal tool 800 for rework. When the overlay offset is within a tolerable range, the substrate carrying tool 700 will carry the substrate to the development tool 600 for developing the photoresist layer.

Figure 4:
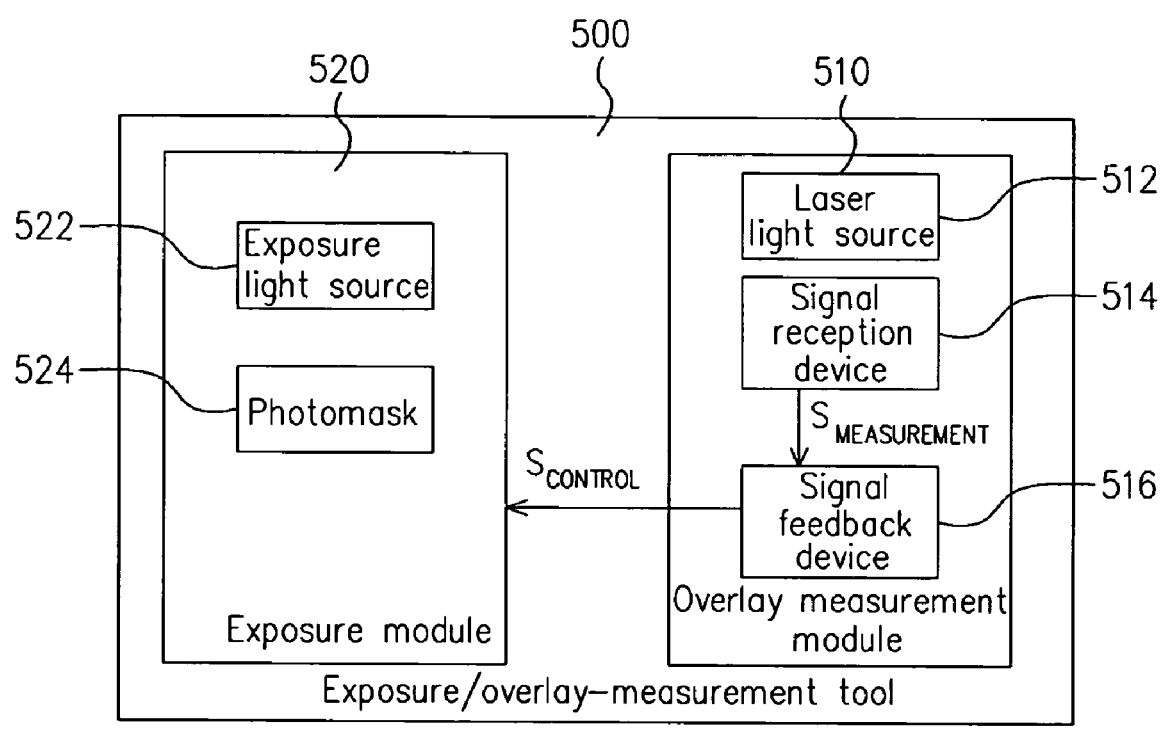
FIG. 4 schematically depicts the exposure/overlay-measurement tool of FIG. 3.

FIG. 4 schematically depicts the exposure/overlay-measurement tool of FIG. 3. The exposure/overlay-measurement tool 500 is constituted of an overlay measurement module 510 and an exposure module 520, for example. The exposure module 520 is for forming a latent image in the photoresist layer. The overlay measurement module 510 is for measuring the overlay offset between the latent image and the predetermined layer and for feeding back a control signal generated based on the overlay offset to the exposure module 520 for calibrating the exposure condition.

Referring to FIG. 4 again, the overlay measurement module 510 may include a laser light source 512, a signal reception device 514 and a signal feedback device 516. The laser light source 512 is used to scan the latent image, the signal reception device 514 is for receiving a test signal $S_{MEASUREMENT}$ generated from the laser scanning that contains the information of the overlay offset. The signal feedback device 516 is used to generate a control signal $S_{CONTROL}$ based on the test signal $S_{MEASUREMENT}$ and feedback the control signal $S_{CONTROL}$ to the exposure module 520 for calibrating the exposure condition. The exposure module 520 includes an exposure light source 522 and a photomask 524, for example, wherein the exposure light source 522 may be disposed over the substrate and the photomask 524 may be disposed between the exposure light source 522 and the substrate.

As mentioned above, since the exposure step and the overlay measurement step are done in the same tool in this invention, the cycle time in the lithography process can be reduced. Moreover, the overlay measurement is performed after the exposure step and before the development step, so that the overlay offset can be fed back to the exposure module in real time to avoid undesired rework. Meanwhile, since the overlay measurement is performed before the development step, the accuracy thereof is better without being affected by the process parameters of the development step. Furthermore, this invention adopts an exposure/overlay-measurement tool instead of the conventional expensive ACML tool, so that the manufacturing cost can be reduced.

In addition, the scanning precision of the exposure/overlay-measurement tool is the same as that of the stepper in current exposure tools, so that the overlay measurement is more precise satisfying the requirements of the next generation of manufacturing process. Moreover, in this invention, sufficient alignment precision of the photoresist patterns can be achieved with slight modification, or even without any modification, to the overlay marks. Therefore, the manufacturing cost is not worried about. Furthermore, this invention allows the scribe line regions on a wafer to be narrowed, so that the gross die number of the wafer can be increased.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for forming a patterned photoresist layer, being used to form a patterned photoresist layer aligned with a predetermined wafer layer and comprising:
    (a) forming a photoresist layer on a substrate;
    (b) exposing the photoresist layer;
    (c) measuring an overlay offset between exposed portions of the photoresist layer and the predetermined layer right after the photoresist layer is exposed;
    (d) determining whether the overlay offset is acceptable or not; and
    (e) developing the photoresist layer if the overlay offset is acceptable.

2. The method of claim 1, further comprising the following process before the step (e) if the overlay offset is not acceptable:
    repeating a step (f) of removing photoresist and the steps (a), (b), (c) and (d) in sequence for at least one cycle until the overlay offset is determined to be acceptable in step (d), wherein an exposure condition in step (b) of each cycle is calibrated according to the overlay offset measured in step (c) of the preceding cycle.

3. The method of claim 1, wherein the step of exposing the photoresist layer produces a latent image in the photoresist layer, and the step of measuring the overlay offset comprises:
    providing a laser beam; and
    scanning the latent image with the laser beam and analyzing a signal generated from the laser scanning to derive the overlay offset.

4. A method for forming a patterned photoresist layer, being used to form a patterned photoresist layer aligned with a predetermined wafer layer and comprising:
   (a) forming a photoresist layer on a substrate;
   (b) using an exposure/overlay-measurement tool to expose the photoresist layer to form a latent image in the photoresist layer;
   (c) using the exposure/overlay-measurement tool to measure an overlay offset between the latent image and the predetermined layer right after the latent image is formed;
   (d) comparing the overlay offset with a predetermined value; and
   (e) developing the photoresist layer if the overlay offset is smaller than the predetermined value.

5. The method of claim 4, further comprising the following process before step (e) if the overlay offset is larger than the predetermined value;
   repeating a step (f) of removing photoresist and the steps (a), (b), (c) and (d) in sequence for at least one cycle until the overlay offset is found to be smaller than the predetermined value in step (d), wherein an exposure condition in step (b) of each cycle is calibrated according to the overlay offset measured in step (c) of the preceding cycle.

6. The method of claim 5, wherein calibrating the exposure condition according to the overlay offset comprises:
   feeding back a control signal generated based on the overlay offset to the exposure/overlay-measurement tool to order the exposure/overlay-measurement tool to calibrate the exposure condition.

7. The method of claim 4, wherein measuring the overlay offset comprises:
   scanning, the latent image with a laser beam provided by the exposure/overlay-measurement tool; and
   analyzing a signal generated from the laser scanning to derive the overlay offset.

* * * * *